US012748143B2

(12) United States Patent
Mestezky

(10) Patent No.: US 12,748,143 B2
(45) Date of Patent: Sep. 29, 2026

(54) MEASUREMENT OF A PHOTOCATHODE CURRENT

(71) Applicant: Applied Materials Israel Ltd., Rehovot (IL)

(72) Inventor: Alexey Mestezky, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 164 days.

(21) Appl. No.: 18/929,476

(22) Filed: Oct. 28, 2024

(65) Prior Publication Data

US 2026/0118403 A1 Apr. 30, 2026

(51) Int. Cl.
*G01R 31/25* (2006.01)
*G01R 19/165* (2006.01)

(52) U.S. Cl.
CPC ..... *G01R 31/252* (2013.01); *G01R 19/16533* (2013.01)

(58) Field of Classification Search
CPC .............. G02B 27/0093; G06F 3/0304; G01R 31/252; G01R 15/146; G01R 19/0092; G01R 31/52; G01R 27/2623; G01R 1/30; G01R 19/16533; G01R 19/16571; G02F 1/3532; H03F 3/087; H03F 3/45475; H10H 29/10; H01J 1/34
See application file for complete search history.

(56) References Cited

U.S. PATENT DOCUMENTS 5,453,610 A * 9/1995 Gibbons ................. G01T 1/208 250/214 AG
7,030,355 B1 * 4/2006 Bochenski .............. H01J 43/28 250/214 SW
7,098,434 B2 * 8/2006 Streun ...................... G01T 1/208 330/42
7,479,623 B2 * 1/2009 Gardner .................. H01J 43/30 250/214 VT
8,618,457 B2 12/2013 Wright

* cited by examiner

*Primary Examiner* — Vinh P Nguyen
(74) *Attorney, Agent, or Firm* — Kilpatrick Townsend & Stockton

(57) ABSTRACT

A measurement device for measuring a photocathode current of a photomultiplier tube, the measurement device includes: (a) a voltage amplifier configured to amplify a shunt resistor voltage proportional to the photocathode current; (b) a leakage tolerant circuit configured to generate a first leakage tolerant voltage, based on a first amplified voltage and a first reference voltage having an absolute value that exceeds an absolute value of a leakage associated with the measurement device; (c) a voltage to current transducer that is configured to convert the first leakage tolerant voltage to a first leakage tolerant current; and (d) an output unit that is configured to convert the first leakage tolerant current to an output voltage that is indicative of the photocathode current.

15 Claims, 6 Drawing Sheets

200

MEASUREMENT OF A PHOTOCATHODE CURRENT

BACKGROUND OF THE INVENTION

Photomultiplier tube gain can be controlled by the applied high voltage to the photocathode (PC) and the voltages applied to its dynodes using bleeder network. Gain of the photomultiplier tube (PMT) varies from unit to unit, as a function of temperature and degrades with time, there is an interest to know the actual gain of the PMT at any moment of the operation, especially if it can be done "on the fly". One of the common methods to measure PMT gain (Gpmt) is measuring anode current (Ia) and a photo-cathode current (Ipc). The ratio between Ia and Ipc equals the gain of the PMT (Gpmt=Ia/Ipc). Ia is always measured during normal operation of the PMT, so there is a need to measure an Ipc.

The measurement of Ipc is subjected to leakage and limited dynamic range.

There is a growing need to provide an accurate and efficient solution for measuring Ipc.

BRIEF SUMMARY OF THE INVENTION

There is provided a method for measurement of a photocathode current as illustrated in the specification.

There is provided a measurement device for measuring a photocathode current of a photomultiplier tube, the measurement device includes (a) a voltage amplifier configured to amplify a shunt resistor voltage that is proportional to the photocathode current to provide a first amplified voltage; (b) a leakage tolerant circuit configured to generate a first leakage tolerant voltage, based on the first amplified voltage and a first reference voltage having an absolute value that exceeds an absolute value of a leakage associated with the measurement device; (c) a voltage to current transducer that is configured to convert the first leakage tolerant voltage to a first leakage tolerant current; and (d) an output unit that is configured to convert the first leakage tolerant current to an output voltage that is indicative of the photocathode current.

There is provided a method for measuring a photocathode current of a photomultiplier tube, the method includes (a) amplifying, by a voltage amplifier, a shunt resistor voltage that is proportional to the photocathode current to provide a first amplified voltage; (b) generating, by a leakage tolerant circuit, a first leakage tolerant voltage, based on the first amplified voltage and a first reference voltage having an absolute value that exceeds an absolute value of a leakage associated with the measurement device; (c) converting, by a voltage to current transducer, the first leakage tolerant voltage to a first leakage tolerant current; and (d) converting, by an output unit, the first leakage tolerant current to an output voltage that is indicative of the photocathode current.

BRIEF DESCRIPTION OF THE DRAWINGS

The subject matter regarded as the invention is particularly pointed out and distinctly claimed in the concluding portion of the specification. The invention, however, both as to organization and method of operation, together with specimens, features, and advantages thereof, may best be understood by reference to the following detailed description when read with the accompanying drawings in which:

Figure 1:
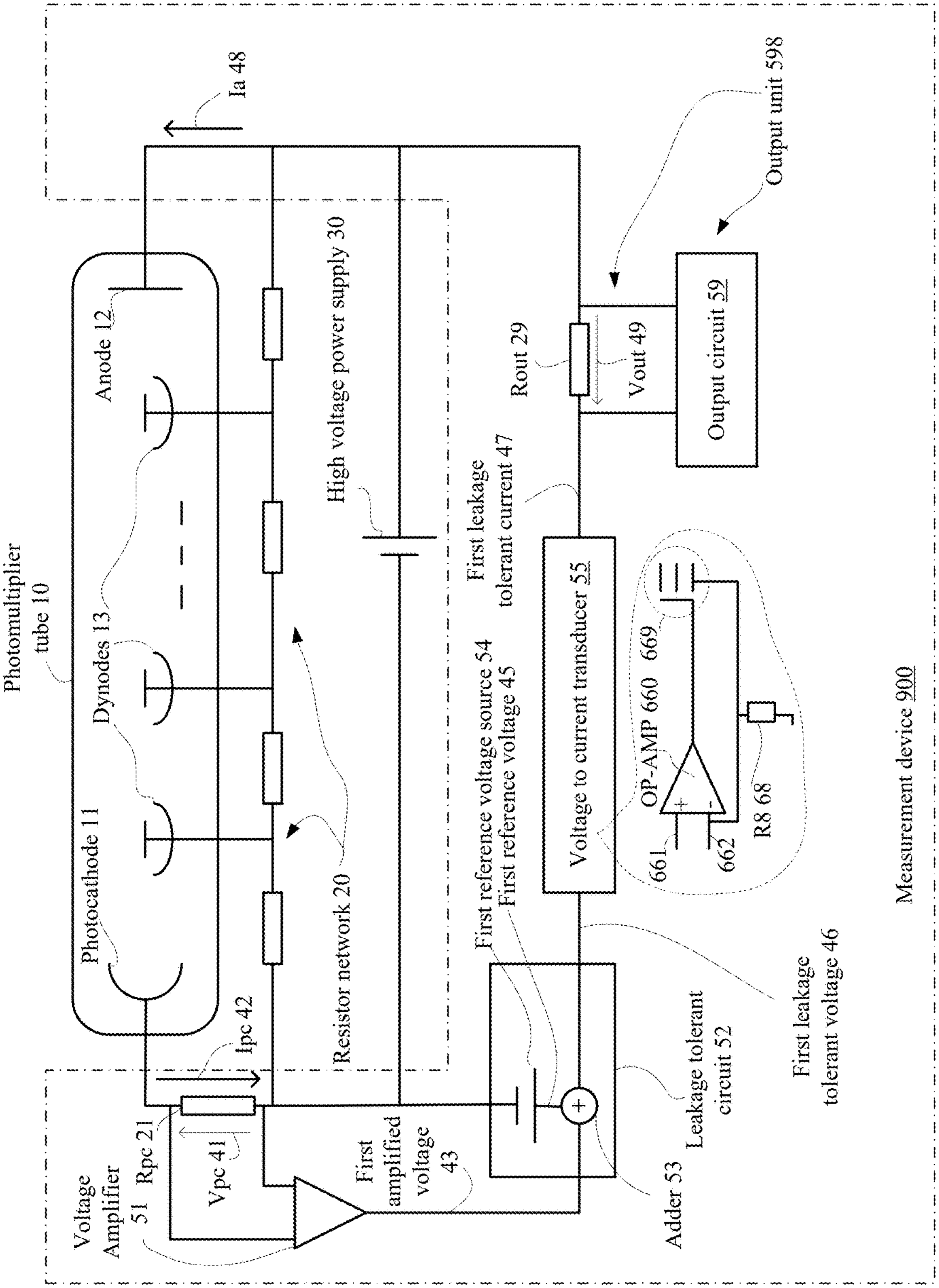
FIG. 1 illustrates an example of a photomultiplier and a measurement device.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

According to an embodiment there is provided a measurement device that is configured to measure a photocathode current of any value, without having the measurement masked by a leakage current.

According to an embodiment there is provided a measurement device that is configured to measure a photocathode current of any value, without having the measurement masked by an offset voltage.

According to an embodiment, there is provided a measurement device that uses low voltage amplifiers and biases the low voltage amplifiers to benefit from virtually an entire dynamic range of signals received by the low voltage amplifiers.

FIG. 1 illustrates an example of a photomultiplier tube 10 that includes a photocathode 11, an anode 12, and dynodes 13 biased by a resistor network 20, wherein the high voltage power supply 30 is connected in parallel to the resistor network. A shunt resistor Rpc 21 is connected in a serial manner between the photocathode 11 and a negative node of HV power supply 30. A photocathode current (Ipc 42) flows through Rpc 21.

The measurement device 900 includes:

a. Voltage amplifier 51 that is configured to amplify a shunt resistor voltage (Vpc 41) that is proportional to the photocathode current (Ipc 42) to provide a first amplified voltage.

b. Leakage tolerant circuit 52 that is configured to generate a first leakage tolerant voltage, based on the first amplified voltage and a first reference voltage having an absolute value that exceeds an absolute value of a leakage associated with the measurement device. According to an embodiment, the first reference voltage is added to the first amplified voltage to provide the first leakage tolerant voltage. This is illustrated in FIG. 1 as having adder 53 that adds the first reference voltage 45 (supplied by first reference voltage source 54) to the first amplified voltage 43.

c. Voltage to current transducer 55 that is configured to convert the first leakage tolerant voltage to a first leakage tolerant current.

d. Output resistor Rout 29 that is configured to receive the first leakage tolerant current 47.

e. Output circuit 59 that is configured to read an output voltage developed on the output resistor, wherein the output voltage is indicative of the photocathode current.

Figure 2:
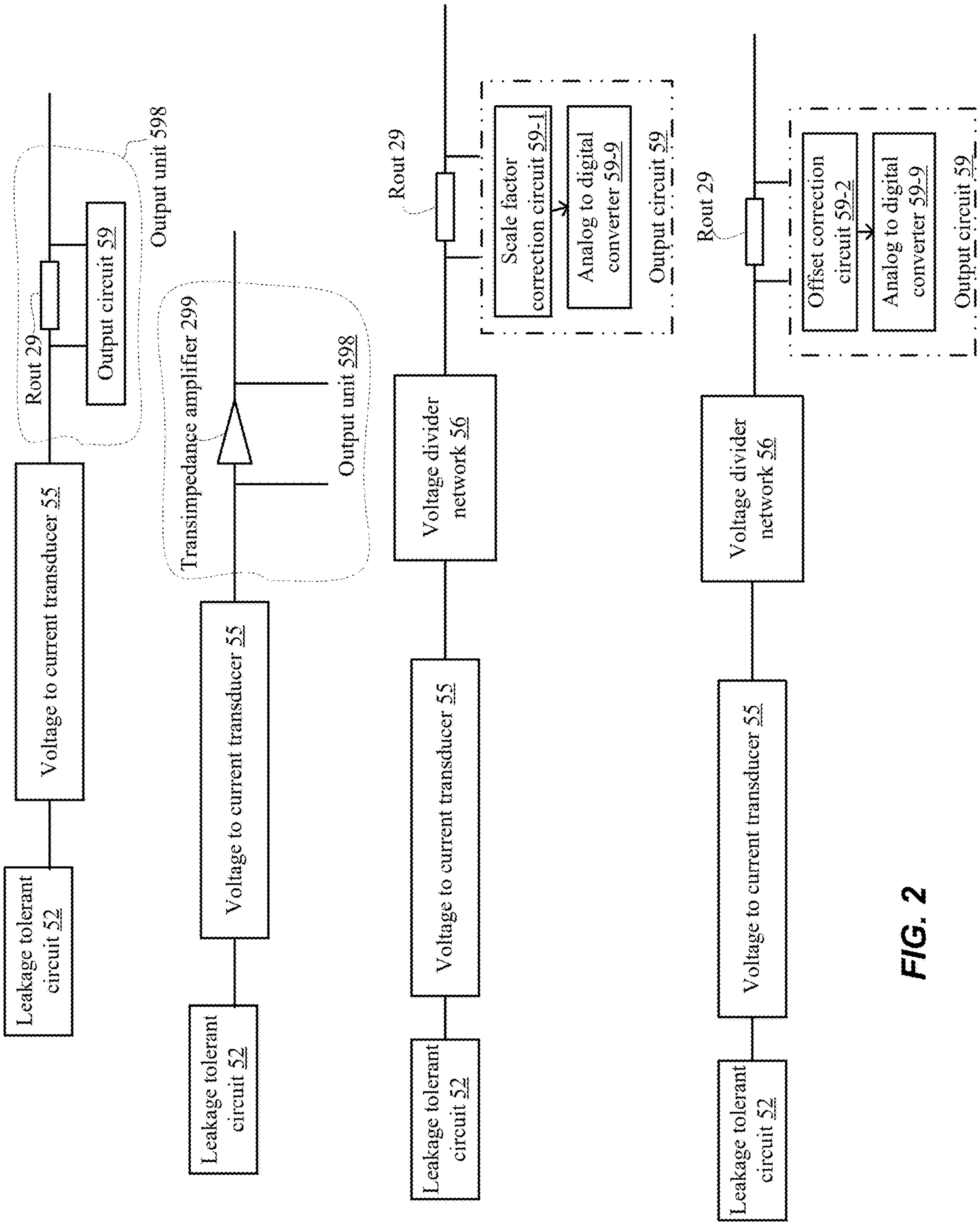
FIG. 2 illustrates examples of measurement devices.
Figure 3:
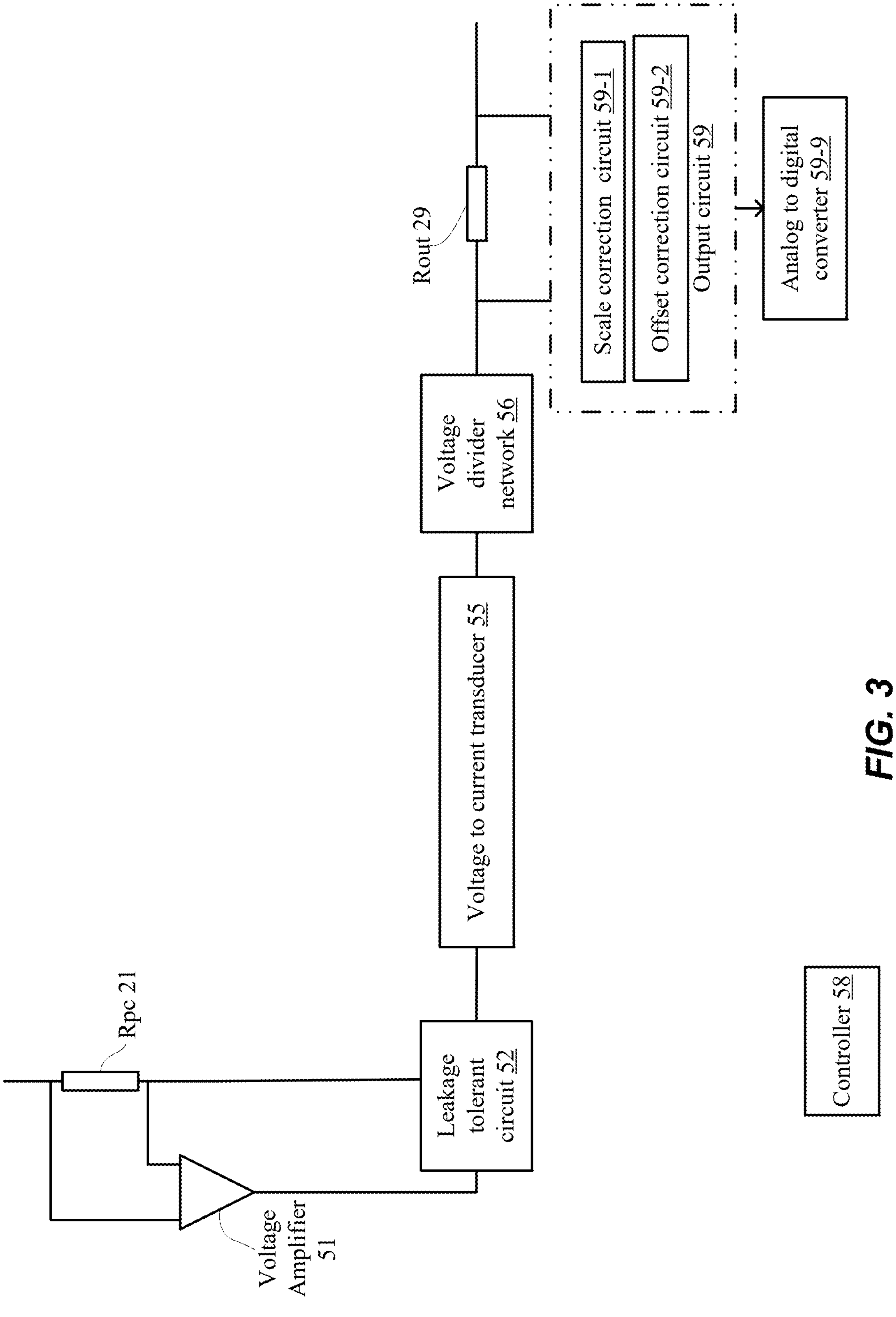
FIG. 3 illustrates an example of a measurement device.

According to an embodiment, the output circuit includes an analog to digital converter (denoted 59-9 in FIGS. 2 and 3), and/or at least one of a scale factor correction circuit (denoted 59-1 in FIGS. 2 and 3) for compensating for the addition of the first reference voltage and an offset correction circuit (denoted 59-2 in FIGS. 2 and 3) for compensating for the offset mitigation step.

According to an embodiment the output unit 598 includes an output resistor (Rout 29) and an output circuit 59.

According to an embodiment the output unit includes a transimpedance amplifier (denoted 299 in FIG. 2) instead of the output resistor- and in this case the output voltage of the transimpedance amplifier is the output circuit 59 that is indicative of the photocathode current. Any reference to the output resistor should be applied mutatis mutandis to the transimpedance amplifier.

According to an embodiment, the voltage to current transducer 55 includes operational amplifier (denoted OP-AMP 660 in FIG. 1) that includes (a) a first operational amplifier input 661 (denoted "+") that is configured to receive the first leakage tolerant voltage 46, and (b) a second operational amplifier input 662 (denoted "−") that is configured to receive the feedback of the output current that flows via the transistor 669 and to output an operational amplifier output signal that controls the transistor 669 to pass a current and is indicative of the photocathode current (Ipc) 42 and the offset supplied by the first reference voltage 45. The first reference voltage has an absolute value that exceeds an absolute value of the equivalent leakage current through transistor 669, as a result, measurement of Ipc will not be masked by the leakage, even when Ipc measurement signal is lower than the equivalent leakage.

According to an embodiment, the voltage to current transducer 55 includes a transducer transistor 669 that is configured to generate the first leakage tolerant current based, at least in part, on the operational amplifier output signal.

According to an embodiment, the high voltage power supply 30 provides a high voltage of hundreds of volts (for example about minus 900 volts) and the transducer transistor is subjected to a source to drain potential difference of that is slightly smaller than the high voltage—the durability of the transducer transistor is increased and the size and cost of the transducer transistor are decreased by providing a voltage divider network (denoted 56 in FIG. 2) for withstanding the voltage difference between GR and VP.

According to an embodiment, the transducer transistor and other transistors and amplifiers of the measurement device are configured to operate when biased with a low voltage bias signal—the low voltage bias signal may have an absolute value that does not exceed six volts or differs than six volts.

According to an embodiment, the measurement device includes a controller (denoted 58 in FIG. 3) that is configured to trigger a measurement, by the measurement device, a dark output voltage that is an output voltage measured when the photomultiplier tube is masked from light, to provide an indication of the leakage.

According to an embodiment, the controller is configured to determine the first reference voltage to have the absolute value that exceeds the absolute value of the leakage.

According to an embodiment, there is provided a controller that is configured to obtain a measurement of an anode current of the photomultiplier tube and determine a gain of the photomultiplier tube by dividing the anode current by the photocathode current.

According to an embodiment, the measurement device does not include a controller and the value of the first reference voltage is determined in advance, based on measurements or simulation of leakage and, additionally or alternatively, offsets, and different operational conditions such as temperature, value of high voltage, age of the photomultiplier tube, and the like.

According to an embodiment, the voltage amplifier is biased to operate over a full range of shunt resistor voltages by being biased by a bias circuit.

According to an embodiment, the measurement device includes a bias circuit that is configured to bias the voltage amplifier (denoted U9 in FIG. 4) with a negative bias voltage that is more negative than a high voltage ground.

Figure 4:
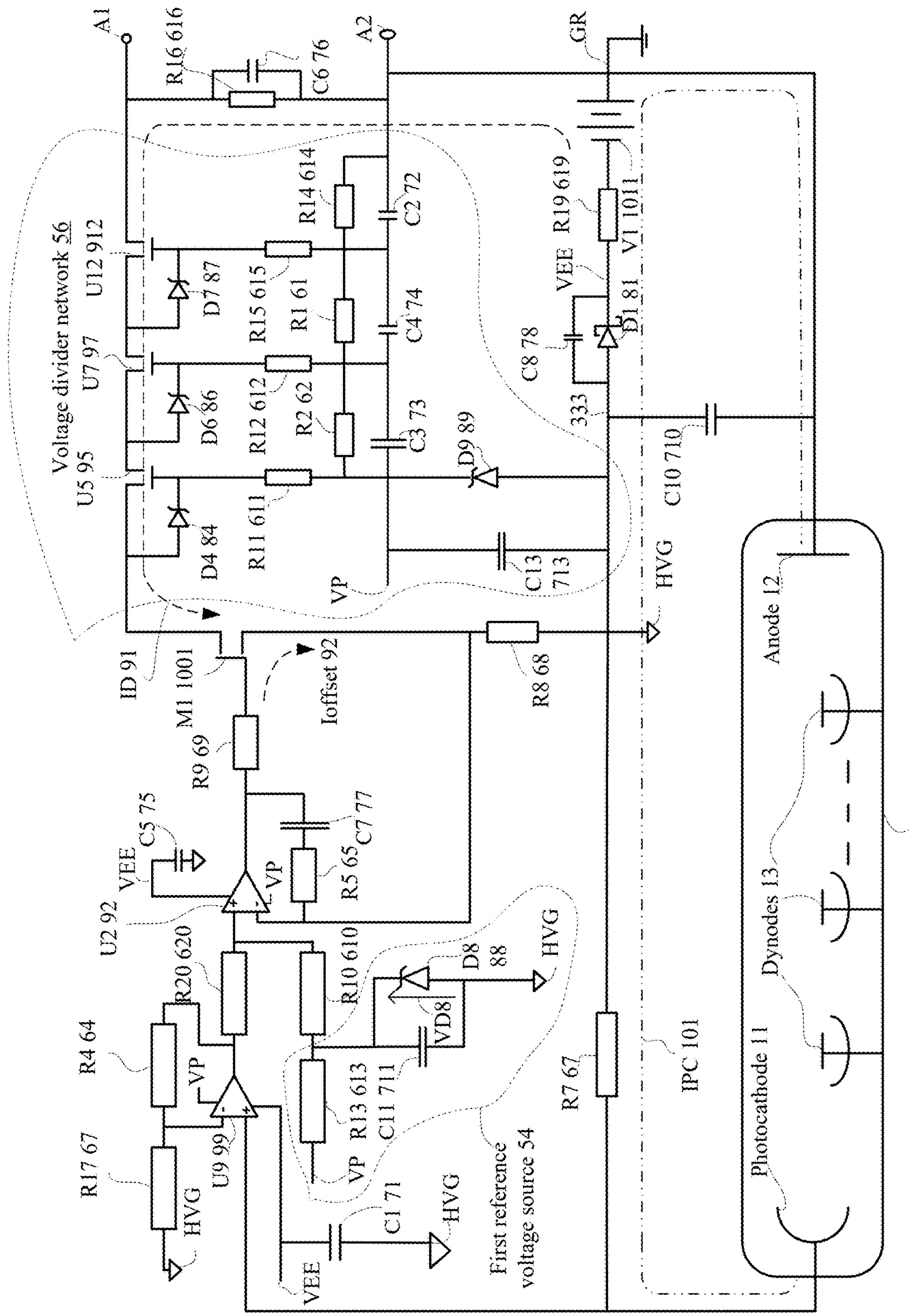
FIGS. 4-5 illustrates an example of a photomultiplier and a measurement device.

According to an embodiment, the bias circuit includes a node that is coupled to an anode of a diode (denoted D1 in FIG. 4) and to a high voltage ground node (denoted HVG in FIG. 4), wherein the negative bias voltage is a voltage of a cathode of the diode (denoted VEE in FIG. 4).

According to an embodiment, the bias circuit is configured to bias the voltage amplifier by a positive bias voltage that is more positive that the high voltage ground.

According to an embodiment, the bias circuit includes a node (denoted 333 in FIG. 4) that is coupled to an anode of Zener diode (denoted D9 in FIG. 4), to an anode of another diode (denoted D1 in FIG. 4), and to a high voltage ground node (denoted HVG in FIG. 4). A positive bias voltage (denoted VP in FIG. 4) is a voltage of a cathode of diode D9 (in FIG. 4).

According to an embodiment, a negative bias voltage (denoted VEE in FIG. 4) is a voltage of a cathode of diode D1 (in FIG. 4).

Figure 5:
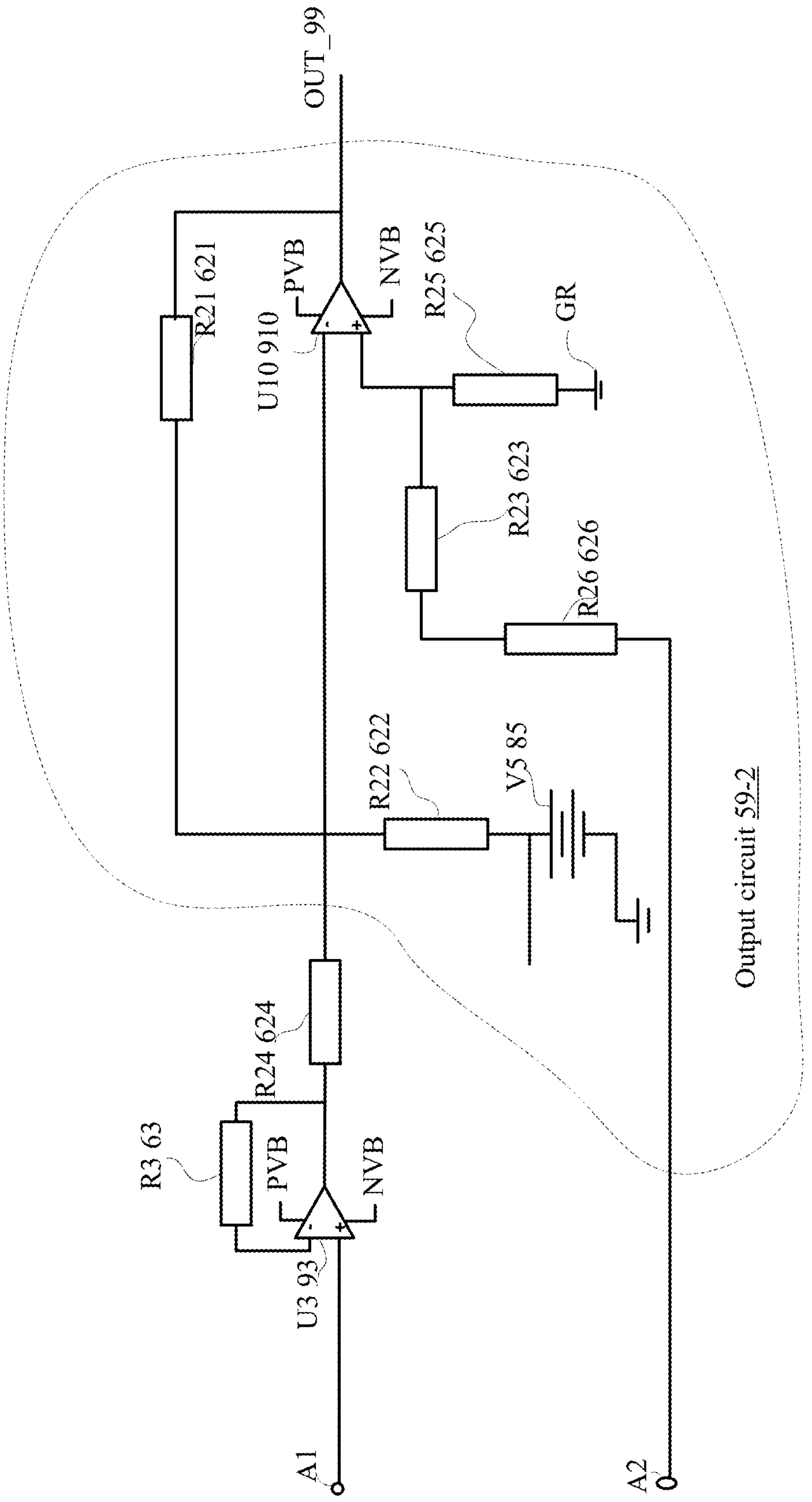

FIG. 4 illustrates a photomultiplier tube and a first part of the measurement device while FIG. 5 illustrates a second part of the measurement device. The parts shown in FIGS. 4 and 5 are virtually connected at points A1 and A2.

The measurement device includes first reference voltage source 54, voltage divider network 56 and output circuit 59-2.

In FIGS. 4 and 5 the following numbering convention was used:

a. There is a first plurality of resistors whereas Rx represents the x'th resistor. See, for example R1 61, R2 62, R14 614, R4 64, R17 617, R20 620, R5 65, R10 610, R13 613, R7 67, R8 68, R19 619, R11 611, R12 612, R15 615, R16 616, R19 619, R3 63, R24 624, R22 622, R23 623, R21 621, R25 625 and R26 626.

b. There is a second plurality of capacitors whereas Cx represents the x'th capacitor. See, for example, C1 71, C11 711, C10 710, C5 75, C7 77, C13 713, C2 72, C3 73, C4 74, C6 76 and C8 78.

c. There is a second plurality of amplifiers whereas Ux represents the x'th amplifier. See, for example, U9 99, U3 93, U2 92, and U10 910.

d. There is a transistor M1 1001.

e. There is a high voltage supply denoted V1 1011.

f. There is a third plurality of a voltages. GR represent the analog ground, HVG represents the high voltage ground, which is hundreds of volts more negative than the analog ground. There are also additional voltages denoted VEE, VP, PVB, and PNVB.

g. There is a fourth plurality of a diodes whereas Dx represents the x'th diode. See, for example D1 81, D4 84, D6 86, D7 87, D8 88 and D9 89.

U10 is an inverter amplifier. M1 is a transducer transistor. U9 is a voltage amplifier. U2 is the operational amplifier. U5 95, U7 97 and U12 912 are MOSFET transistors. Correction voltage source V5 is denoted 85.

FIG. 4 shows photomultiplier tube connected to the high voltage power supply, while the anode is connected to the analog ground and the photocathode connected to a high voltage negative potential of about minus 900 volts. Photocathode current Ipc 101 flows through shunt resistor R7 to the high voltage power supply. Voltage drop on R7, generated by Ipc, is amplified by a non-inverting voltage amplifier U9.

The gain of U9 is $$G_{U9} = 1 + \frac{R_4}{R_{17}}.$$

Output voltage of U9 via R20, and output of leakage tolerant circuit (D8, C11, R13) via R10, form a control voltage of the voltage-controlled current source (U2, M1, R8, R9, R5, C7, C5). Voltage-controlled current source sinks current ID (M1), which flows from V1 through R16, voltage divider, M1, D1, R19 back to V1.

$$I_{D(M1)} = \frac{V_{U2(+)}}{R_8} = \frac{\frac{1}{R_{20}+R_{10}} \cdot \left[ \overbrace{I_{PC} \cdot R_7 \cdot G_{U9} \cdot R_{10}}^{\text{signal of interest}} + \overbrace{V_{D8} \cdot R_{20}}^{\text{leakage comp.}} \right]}{R_8}$$

Negative voltage at node A1 (referenced to analog ground Gr) is generated on R16 by ID (M1), buffered by low bias current amplifier U3 (of FIG. 5), and after offset and scaling compensation sent to analog to digital converter ("out" signal).

Leakage Tolerant Circuit

Low consumption current shunt voltage reference, D8, generates constant control signal at the input of voltage controlled current source, as a result, continuous "dark" current flows through the voltage controlled current source. The circuit elements are determined in a way that the "dark" current is higher than MOSFETs (U5, U7, U12 in FIG. 4) IDSS (drain-source leakage) current.

Voltage Divider Network

An active voltage divider network based on transistors equally divides the voltage drop (almost all V1 voltage) between its transistors (U5, U7, U12). Active voltage divider network widely used in photomultiplier tubes, see for example, U.S. Pat. No. 8,618,457 being incorporated herein by reference.

Output Circuit

The output circuit 59 compensates for the voltage drop on R16 caused by "dark" current and any other side effects, like temperature. This network maximally "fits" (creates gain and offset corrections) the output voltage range of the circuit to the analog to digital converter (not shown) input voltage range. Correction voltage source V5 85 may be implemented by digital to analog converter for more flexible and dynamic corrections during circuit operation (on the fly). R26 and R23 are optional for cancellation of grounds voltage differences, if any in the practical circuit.

The output voltage equals $$V_{OUT\_99} = [-I_{D(M1)} \cdot R_{16} + V_5] \cdot \frac{-R_{21}}{R_{22}}.$$

In an example, $$R_{22} = R_{24}.$$

Reading Ipc Currents Down to 0 nA

D1 creates voltage drop of 0.2V-0.7V (depends on the diode used) and at its cathode generated voltage, VEE is negative relative to HVG. VEE is used as negative voltage supply for U9 and U2, whereas this eliminates clamping of the measured current at its minimum, caused by input bias current and input offset voltage of U9, and allows measuring of Ipc values down to 0 nA.

Figure 6:
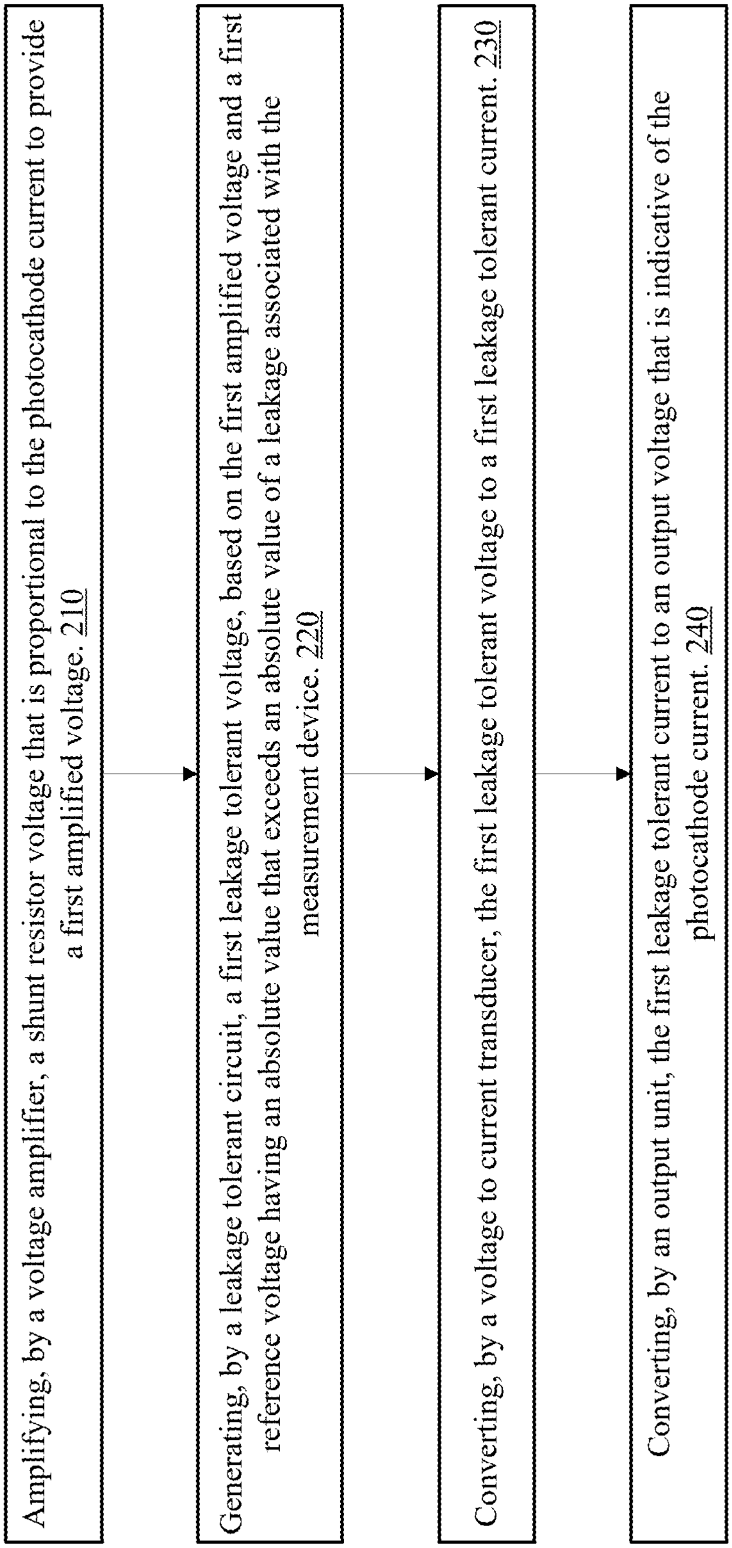
FIG. 6 illustrates an example of a method.

FIG. 6 is an example of method 200 for measuring a photocathode current of a photomultiplier tube.

According to an embodiment, method 200 includes operating any of the measurement devices illustrated in this application.

According to an embodiment, method 200 includes:

a. Step 210 of amplifying, by a voltage amplifier, a shunt resistor voltage that is proportional to the photocathode current to provide a first amplified voltage.
b. Step 220 of generating, by a leakage tolerant circuit, a first leakage tolerant voltage, based on the first amplified voltage and a first reference voltage having an absolute value that exceeds an absolute value of a leakage associated with the measurement device.
c. Step 230 of converting, by a voltage to current transducer, the first leakage tolerant voltage to a first leakage tolerant current.
d. Step 240 of converting, by an output unit, the first leakage tolerant current to an output voltage that is indicative of the photocathode current.

According to an embodiment, the output unit includes an output resistor and the methos includes receiving, by the output resistor the first leakage tolerant current, reading, by the output circuit, the output voltage developed on the output resistor.

According to an embodiment, the output unit includes a transimpedance amplifier, and the method includes converting, by the transimpedance amplifier, the first leakage tolerant current to the output voltage.

According to an embodiment, the leakage tolerant circuit includes a first reference voltage source and an adder, and the method includes generating, by the first reference voltage source, the first reference voltage, and adding, by the adder, the first reference voltage to the first amplified voltage.

According to an embodiment, the voltage to current transducer includes an operational amplifier that includes a first operational amplifier input and a second operational amplifier input, and the method includes (a) receiving, by the first operational amplifier input, the first leakage tolerant voltage, (b) receiving, by the second operational amplifier input, an output current that flows through a transducer transistor, and (c) outputting, by the operational amplifier an operational amplifier output signal that is indicative of the photocathode current when the first leakage tolerant voltage exceeds the leakage.

According to an embodiment, the method includes generating, by the transducer transistor, the first leakage tolerant current based, at least in part, on the operational amplifier output signal.

According to an embodiment, the method includes triggering, by a controller, a measurement of a dark output voltage that is an output voltage measured when the photomultiplier tube is masked from light, to provide an indication of the leakage.

According to an embodiment, the method includes determining, by the controller, whether the first reference voltage has an absolute value that exceeds the absolute value of the leakage.

According to an embodiment, the method includes biasing, by a bias circuit, the voltage amplifier with a negative bias voltage that is more negative than a high voltage ground.

According to an embodiment, the bias circuit includes a node that is coupled to an anode of a diode and to a high voltage ground node, wherein the negative bias voltage is a cathode voltage of the diode.

According to an embodiment, the method includes biasing, by the bias circuit, the voltage amplifier by a positive bias voltage that is more positive than the high voltage ground.

According to an embodiment, the bias circuit includes a node that is coupled to an anode of a Zener diode, to an anode of another diode that differs from the Zener diode and to a high voltage ground node, wherein the bias voltage is a voltage of a cathode of the other diode.

According to an embodiment, the negative bias voltage is a voltage of a cathode of the Zener diode.

According to an embodiment, the method includes obtaining, by a controller, a measurement of an anode current of the photomultiplier tube, and determining gain of the photomultiplier tube by dividing the anode current by the photocathode current.

In the foregoing detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using mechanical components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term and/or means additionally or alternatively. For example, A and/or B means only A, or only B or A and B.

In the foregoing specification, the embodiments of the disclosure have been described with reference to specific examples of embodiments. It will, however, be evident that various modifications and changes may be made therein without departing from the broader spirit and scope of the appended claims.

Moreover, the terms “front,” “back,” “top,” “bottom,” “over,” “under” and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any reference to the term “comprising” or “having” or “including” should be applied mutatis mutandis to “consisting” and additionally or alternatively should be applied mutatis mutandis to “consisting essentially of”.

Any arrangement of components to achieve the same functionality is effectively “associated” such that the desired functionality is achieved. Hence, any two components herein combined to achieve a particular functionality may be seen as “associated with” each other such that the desired functionality is achieved, irrespective of architectures or intermedial components. Likewise, any two components so associated can also be viewed as being “operably connected,” or “operably coupled,” to each other to achieve the desired functionality.

In the claims, any reference signs placed between parentheses shall not be construed as limiting the claim. The word ‘comprising’ does not exclude the presence of other elements or steps than those listed in a claim. Furthermore, the terms “a” or “an,” as used herein, are defined as one or more than one. Also, the use of introductory phrases such as “at least one” and “one or more” in the claims should not be construed to imply that the introduction of another claim element by the indefinite articles “a” or “an” limits any particular claim containing such introduced claim element to embodiments containing only one such element, even when the same claim includes the introductory phrases “one or more” or “at least one” and indefinite articles such as “a” or “an.” The same holds true for the use of definite articles. Unless stated otherwise, terms such as “first” and “second” are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A measurement device for measuring a photocathode current of a photomultiplier tube, the measurement device comprising:

a voltage amplifier configured to amplify a shunt resistor voltage that is proportional to the photocathode current to provide a first amplified voltage;

a leakage tolerant circuit configured to generate a first leakage tolerant voltage, based on the first amplified voltage and a first reference voltage having an absolute value that exceeds an absolute value of a leakage associated with the measurement device;

a voltage-to-current transducer configured to convert the first leakage tolerant voltage to a first leakage tolerant current; and an output unit configured to convert the first leakage tolerant current to an output voltage indicative of the photocathode current.

2. The measurement device according to claim 1, wherein the output unit comprises an output resistor configured to receive the first leakage tolerant current, and an output circuit configured to read the output voltage developed on the output resistor.

3. The measurement device according to claim 1, wherein the output unit comprises an a transimpedance amplifier configured to convert the first leakage tolerant current to the output voltage.

4. The measurement device according to claim 1, wherein:

the leakage tolerant circuit comprises a first reference voltage source and an adder, the first reference voltage source is configured to generate the first reference voltage, and the adder is configured to add the first reference voltage to the first amplified voltage.

5. The measurement device according to claim 1, wherein the voltage to current transducer comprises an operational amplifier that comprises (a) a first operational amplifier input configured to receive the first leakage tolerant voltage, and (b) a second operational amplifier input configured to receive the feedback, and wherein the operational amplifier is configured to output an operational amplifier output signal that is indicative of the photocathode current when the first leakage tolerant voltage exceeds the leakage.

6. The measurement device according to claim 5, wherein the voltage to current transducer comprises a transducer transistor configured to generate the first leakage tolerant current based, at least in part, on the operational amplifier output signal.

7. The measurement device according to claim 1, further comprising a controller configured to trigger a measurement, by the measurement device, of a dark output voltage that is an output voltage measured when the photomultiplier tube is masked from light, to provide an indication of the leakage.

8. The measurement device according to claim 7, wherein the controller is configured to determine the first reference voltage to have the absolute value that exceeds the absolute value of the leakage.

9. The measurement device according to claim 1, further comprising a bias circuit configured to bias the voltage amplifier with a negative bias voltage that is more negative than a high voltage ground.

10. The measurement device according to claim 9, wherein the bias circuit comprises a node that is coupled to an anode of a diode and to a high voltage ground node, wherein the negative bias voltage is a cathode voltage of the diode.

11. The measurement device according to claim 9, wherein the bias circuit is configured to bias the voltage amplifier by a positive bias voltage that is more positive than the high voltage ground.

12. The measurement device according to claim 11, wherein the bias circuit comprises a node that is coupled to an anode of a Zener diode, to an anode of another diode that differs from the Zener diode, and to a high voltage ground node, wherein the bias voltage is a voltage of a cathode of the other diode.

13. The measurement device according to claim 11, wherein the negative bias voltage is a voltage of a cathode of the Zener diode.

14. The measurement device according to claim 1, further comprising a controller that is configured to obtain a measurement of an anode current of the photomultiplier tube, and determine a gain of the photomultiplier tube by dividing the anode current by the photocathode current.

15. A method for measuring a photocathode current of a photomultiplier tube, the method comprising:

amplifying, by a voltage amplifier, a shunt resistor voltage that is proportional to the photocathode current to provide a first amplified voltage;

generating, by a leakage tolerant circuit, a first leakage tolerant voltage, based on the first amplified voltage and a first reference voltage having an absolute value that exceeds an absolute value of a leakage associated with the measurement device;

converting, by a voltage-to-current transducer, the first leakage tolerant voltage to a first leakage tolerant current; and converting, by an output unit, the first leakage tolerant current to an output voltage that is indicative of the photocathode current.

* * * * *